United States Patent [19]

Aichert et al.

[11] 4,230,739
[45] Oct. 28, 1980

[54] METHOD OF EVAPORATING MELTS OF ALLOYS OF METALS HAVING DIFFERENT VAPOR PRESSURES

[75] Inventors: Hans Aichert; Walter Dietrich, both of Hanau am Main; Alfred Hauff, Bruchköbel; Peter Sommerkamp, Hanau am Main; Herbert Stephan, Bruchköbel, all of Fed. Rep. of Germany

[73] Assignee: Leybold-Heraeus GmbH, Cologne, Fed. Rep. of Germany

[21] Appl. No.: 963,236

[22] Filed: Nov. 22, 1978

[30] Foreign Application Priority Data

Mar. 21, 1978 [DE] Fed. Rep. of Germany ....... 2812285

[51] Int. Cl.² .............................................. B05D 3/06
[52] U.S. Cl. .............................. 427/42; 219/121 EB; 427/250
[58] Field of Search ....................... 427/42, 250; 13/31; 219/121 EB, 121 EM; 118/49.1, 49.5, 50.1

[56] References Cited

U.S. PATENT DOCUMENTS

| | | | |
|---|---|---|---|
| 3,432,335 | 3/1969 | Schiller et al. | 427/42 |
| 3,582,529 | 6/1971 | Anderson et al. | 13/31 R |
| 4,110,893 | 9/1978 | Elam et al. | 427/250 |

*Primary Examiner*—John H. Newsome
*Attorney, Agent, or Firm*—Sprung, Felfe, Horn, Lynch & Kramer

[57] ABSTRACT

Method for evaporating melts of alloys of metals of different vapor pressures from continuously fed, large-area evaporating crucibles by direct bombardment of the bath surface with focused electron beams which are periodically deflected according to a pattern. The alloy material is deposited on a plurality of substrates such as turbine blades which are positioned in a field above the evaporating crucible with local adaptation of the energy density to the thermal economy of the melt bath. At least one electron beam is deflected onto at least two substantially rectangular beam fields and is guided in each of these fields through a line raster at a frequency of at least 100 Hz while shifting periodically from one to the other field with a shift frequency of at most 5 Hz.

9 Claims, 3 Drawing Figures

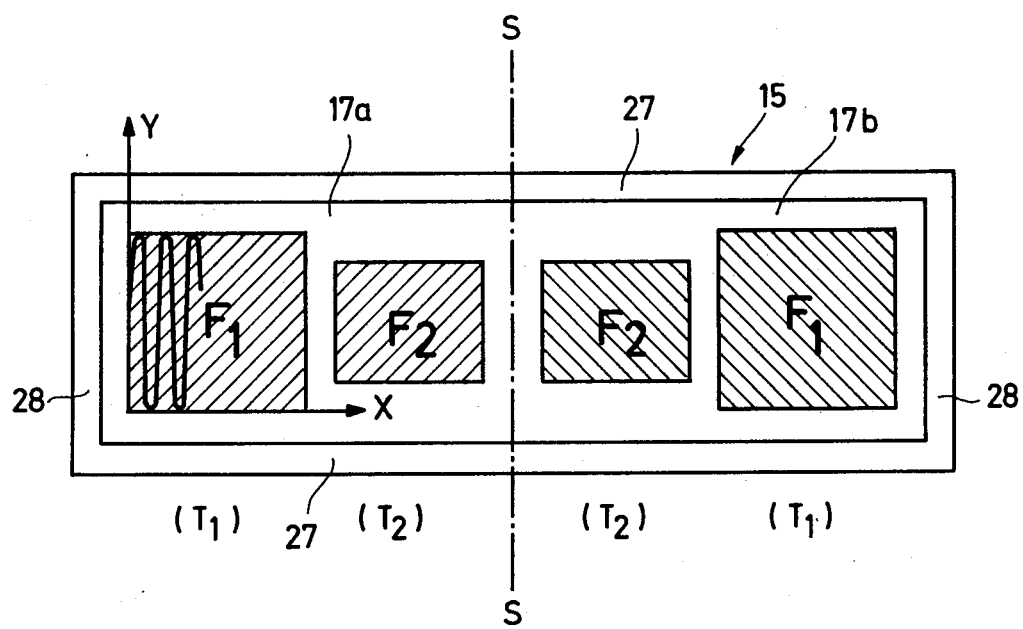

METHOD OF EVAPORATING MELTS OF ALLOYS OF METALS HAVING DIFFERENT VAPOR PRESSURES

BACKGROUND

This invention relates to a method for the vacuum depositing of molten alloys of metals having vapor pressures that are different from one another, from continuously fed, large-area evaporation crucibles, by direct bombardment of the bath surface with focused electron means periodically deflected according to a pattern, and for the deposition of the alloy material on a plurality of substrates which are disposed in a field above the evaporating crucible, with the local adaptation of the energy density to the thermal economy of the molten bath.

From a publication by the Chromalloy American Corporation, New York, entitled, "High Temperature Resistant Coatings for Superalloy," by Seelig et al., it is known to coat gas turbine blades with oxidation and corrosion resistant coating of, for example, CoCrAlY and NiCoCrAlY. In this case the coating or coatings of an individual bucket must be largely homogeneous, i.e., it must not vary in composition from the beginning to the end of the depositing process. If the process is to be performed on a large industrial scale, a number of blades must be coated simultaneously in a single depositing operation. This requires evaporating crucibles of large surface area. The variations in the thicknesses of the coatings and the compositions thereof must not exceed relatively close tolerances from one substrate to the next, However, vacuum depositing processes are subject to what are known as margin effects, i.e., the thickness and composition of the coating on substrates located at the margin of the evaporating crucible generally differ from those of the substrates located in the middle. To prevent a decrease in the coating thickness towards the margin it is known to increase the "dwell time," i.e., the time which an electron beam oscillating over the bath surface spends at the ends of the crucible. However, the problem of varying alloy compositions cannot be solved by this method.

It is furthermore known from U.S. Pat. No. 3,582,529 to guide a partially focused electron beam over the entire bath surface according to a particular deflection pattern. To equalize the varying energy density at the various areas struck by the electron beam, it is recommended that the dwell time of the beam at the various impinged areas be independently variable. This, however, serves principally to compensate for the negative influence of the different angles of deflection on the beam geometry or on the size of the focal spot. The size of the focal spot itself remains unaffected or is allowed to vary as it will. For the deposition of homogeneous alloy coatings on a plurality of substrates from large-area evaporating crucibles, the known method is therefore unsuitable. Consideration must be given to the fact that, in the vaporization of an alloy, the composition of the deposited coating will depend substantially on the temperature level of the evaporating surface of the molten alloy, i.e., on the energy density, while the thickness of the deposited coating is influenced substantially by the dwell time of the electron beam on the bath surface.

SUMMARY

The invention provides a method of the kind initially described whereby the local variation of the alloy composition and of the coating thickness can be largely counteracted, and whereby it will be possible to produce homogeneous coatings not only on the same substrate but on all of the substrates of the same batch.

This is accomplished in accordance with the invention by the fact that at least one electron beam is deflected so as to shift periodically at a shift frequency of at most 10 Hz, preferably of no more than 5 Hz, from one to another of at least two substantially rectangular beam fields $F_1$, $F_2$ ... on the surface of the bath, and is guided within each of these fields at a frequency of at least 100 Hz, preferably of at least 300 Hz, over a line raster, the dwell time of the electron beam within each field being selected as $T_1$, $T_2$; that the area ratios of the beam fields $F_1$, $F_2$ ... and the relative dwell times $T_1$, $T_2$, ... are freely adjustable independently of one another, and that the sum of the areas of all beam fields amounts to between 10% and 80%, preferably between 30% and 70% of the area of the bath surface.

DESCRIPTION

The invention makes it possible to adjust both the size of the beam fields and the time the beam dwells within these beam fields independently of one another. In other words, the adjustment of the size of the individual beam fields and the adjustment of the individual dwell times are separated from one another. The dwell times do not serve—as they do for example in the case of DAS 2,047,138—for the equalization of the vagaries of focal spot diameters, and in fact they can even be made to do just the opposite. The differences between the shift frequency on the one hand and the line raster scanning frequency on the other are likewise of essential importance. The shift frequency is deliberately kept low in relation to the line raster scanning frequency, so that the evaporation or the condensation, as the case may be, of the individual alloy components, can be influenced in accordance with the particular application. The mechanism involved is not fully understood but it has been found that, by means of an appropriately long dwell time of the beam within the individual beam fields, a preferred vaporization of particular alloy components is accomplished, while the vaporization of other alloy components is relatively suppressed. This effect is not observed at a shift frequency greater than 10 Hz.

Also important is the fact that the sum of the areas of all beam fields amounts to between 10% and 80%, preferably between 30% and 70%, of the area of the bath surface. For it has been found that even the portions of the bath surface which are not occupied by the beam fields have a considerable share in the overall evaporation rate, and it is believed that low-boiling metals such as chromium, for example, are evaporated preferentially from the portions of the surface which are not bombarded by the electron beam, while within the beam fields, i.e., in the surface areas bombarded by the electron beam, a relatively greater evaporation of the high-boiling metals takes place, so that in this manner a certain compensation can be brought about.

The level of the frequencies and the magnitude of the beam fields can be found within the above-described ranges by simple testing. Likewise, the values for the individual beam fields and the dwell times can be found by simple experiment. Particularly advantageous setting ranges and settings for the parameters $F_1$, $F_2$ and $T_1$, $T_2$ are as follows.

If the bath surface is bombarded on beam fields $F_1$, $F_2$ ... of different size, the arrangement of the beam fields is made symmetrical from the center of the bath ($F_1$, $F_2$ ... – ... $F_2$, $F_1$). Preferably, the larger beam fields $F_1$ are on the outside and the area ratio $F_1:F_2$ is between 1.2:1 and 5:1. The longer dwell time $T_1$ of the electron beam is put in the outer beam fields, the relative dwell time $T_1:T_2$ being between 1.2:1 and 3:1. The area ratio $F_1:F_2$ is preferably 2:1 and the relative dwell time $T_1:T_2$ is 2:1.

The beam fields $F_1$, $F_2$, ... can be positioned to partially overlap one another on the bath surface. The line interval within at least one field can be varied over one of the field dimensions, the line density per unit of length being adapted to the local energy requirement.

Means are known for controlling the electron guns required for the process as regards the beam deflection and the dwell time. The conventional electron guns have for this purpose an X-Y deflection system and a preferably programmable control circuit associated with this deflection system, whereby the electron beam can be deflected in virtually any desired pattern. For example, a rectangular area can be scanned with a line raster in a manner well known in television picture tubes. The size of the rectangle can be controlled by varying the deflection voltage. The sweep frequency can remain unchanged within a single beam field, in which case a longer dwell time can be achieved by performing the scanning of the same beam field several times in succession. The frame frequency can be the same as the power mains frequency, for example, while the periodical shifting of the beam from one beam field to the other can take place at one-minute intervals.

When the measure of the invention is used, especially with settings described above, homogeneous coatings can be obtained, i.e., coatings of uniform thickness and uniform composition, even on a plurality of substrates. This is the case even with difficult-to-produce surface coatings of CoCrAlY and NiCoCrAlY. The coatings deposited on gas turbine blades are to have, for example, the following composition:
Cobalt: 72.0%
Chromium: 17.0%
Aluminum: 10.0%
Yttrium: 0.4%

The starting material used for the production of the surface coatings, and from which the bath in the evaporating crucible is formed, can expediently have the following composition:
Cobalt: 65.0%
Chromium: 22.0%
Aluminum: 12.0%
Yttrium: 0.4%

In the bath itself, some of the percentages change considerably. An average bath composition found by analysis reads, for example, as follows:
Cobalt: 70.0%
Chromium: 26.0%
Aluminum: 13.0%
Yttrium: 0.3%

If, for example, an increase in the chromium content is observed on the more inwardly located substrates, it is recommended to reduce mainly the irradiation area pertaining to the substrates involved. If an increase in the coating thickness on the more inwardly located substrates is found, it is recommended to shorten mainly the dwell time of the beam within the irradiation areas pertaining to those substrates.

An embodiment of the invention will be explained in detail with the aid of FIGS. 1 to 3.

FIG. 3 is a top view of the evaporating crucible and the bath surface with the fields on the bath surface which are scanned by the electron beams.

Figure 1:
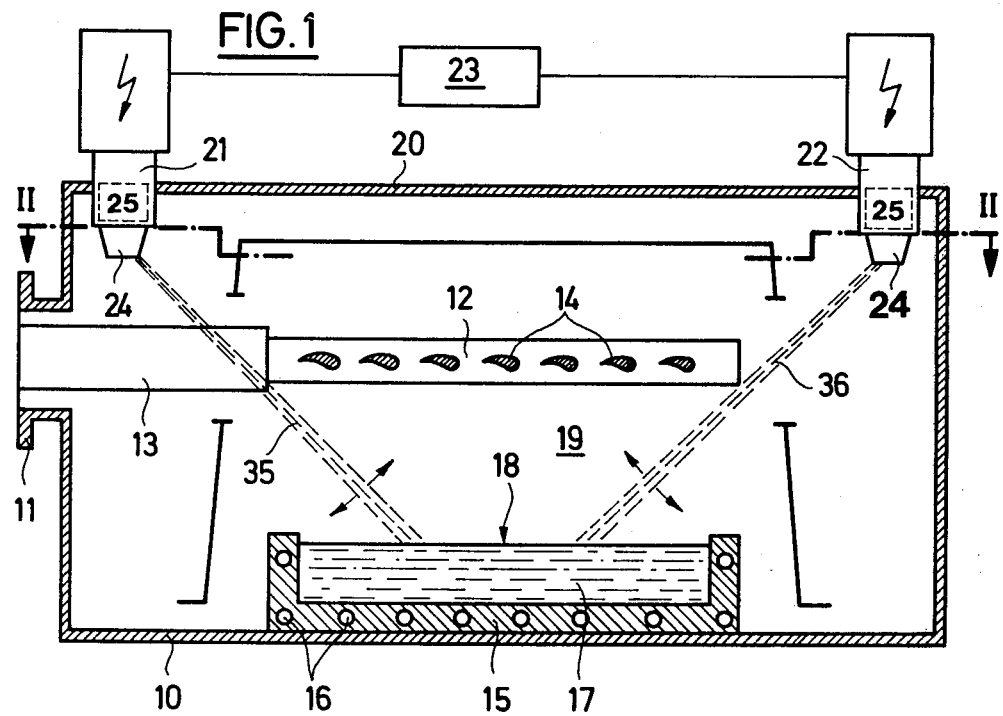
FIG. 1 is a vertical cross sectional view taken through a vacuum depositing apparatus for the discontinuous coating of turbine buckets.
Figure 2:
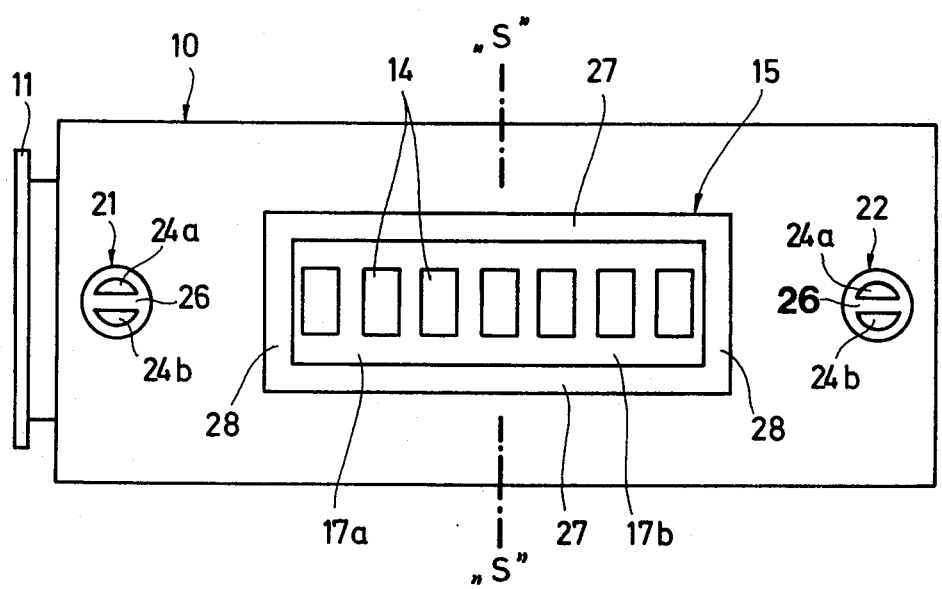
FIG. 2 is a cross sectional view taken along line II—II of FIG. 1.

In FIG. 1 can be seen a vacuum chamber 10 which has on its left side a connecting flange 11 for connection to a lock chamber (not shown) and has a preheating chamber (not shown). Through the connecting flange 11 there extends horizontally into the vacuum chamber 10 a substrate holder 12 which is fastened to a rod 13. A plurality of substrates 14 in the form of turbine blades are fastened to the substrate holder 12 in such a manner that they completely cover the horizontal area assigned to them except for small spaces between them.

Underneath the substrate holder 12 is an evaporating crucible 15, which consists of metal and has cooling passages 16. In the evaporating crucible is a bath 17 of molten vacuum coating material. The material expended by evaporation is replaced by an automatic feeding means which is not shown. Between the bath surface 18 and the substrates 14 there is formed an approximately parallelipipedal space 19 through which the vapor ascends from the bath surface 18 to the substrates 14.

In a roof 20 of the vacuum chamber 10 there are disposed two electron guns 21 and 22 which are supplied with electrical energy through a control system 23. This control system supplies the guns 21 and 22 not only with the necessary high voltage but also with the heater voltage for the cathodes of the guns. Furthermore, the control system 23 also generates the deflection signals for deflecting the electron beam. For the purpose of beam deflection, the guns 21 and 22 are provided with an X-axis deflection system 24 and a Y-axis deflection system 25. The X-axis deflection system consists of two projecting pole shoes 24a and 24b which enclose between them an air gap 26 through which pass the magnetic lines of force. Within this air gap, the electron beam can be deflected by an angle of as much as 90° or more. The Y-axis deflection system produces only a slight beam deflection and consequently it can be disposed with the electron guns 21 and 22 as indicated in broken lines.

The evaporation crucible 15 has a rectangular plan with two long sides 27 and two short sides 28. The bath 17 is divided by the short axis of symmetry "S" into two halves 17a and 17b.

Above the bath surface 18 and laterally beyond the short sides 28 there are disposed the electron guns 21 and 22 whose axes are situated in a plane of symmetry of the evaporating curcible 15 which is perpendicular to the short plane of symmetry "S" (section plane of FIG. 1).

The electron guns 21 and 22 produce electron beams 35 and 36 which, after emerging from the X-axis deflection system, strike the bath surface 18 at an angle and scan it in directions X and Y according to the surface pattern to be further explained in FIG. 3. The electron beam 35 is associated with the left bath half 17a and electron beam 36 is associated with the right bath half 17b.

The system of the X-axis and Y-axis coordinates is indicated in FIG. 3. On the left half 17a of the bath are two beam fields $F_1$ and $F_2$ which are swept by the electron beam 35 in a line raster as represented by way of indication in the left beam field $F_1$. The ratio of the beam field areas $F_1:F_2$ amounts to about 2:1. The dwell time $T_1$ of the electron beam within beam field $F_1$ is in a ratio of approximately 2:1 to the dwell time $T_2$ within beam field $F_2$. The same ratios prevail in reverse order in the right half 17b of the bath. The electron beam shifts periodically, at the end of the given dwell time ($T_1$ amounts to about 60 seconds), from the one beam field to the other. In other words, field $F_1$ is first bombarded by both electron beams 35 and 36, and then the electron beams shift automatically to the fields $F_2$. This shift is repeated periodically throughout the vacuum coating time. It is important here that the individual beam fields $F_1$ and $F_2$ be scanned by a focused electron beam whose focus is necessarily many times smaller than the dimensions of the fields. By means of precisely established amplitudes of the deflection voltages it is possible to keep the pattern of the sweeping of the field extremely precise. What is involved here is not the focal spot of a diffuse electron beam.

The dimensions of the fields and the relative dwell times can also be controlled during the evaporation cycle for the purpose of giving the deposited coating a particular depth profile. For example, the coating can be designed for optimum strength of adhesion at the interface between the coating and substrate, on the basis of diffusion and coefficients of expansion, while the surface of the coating can be designed for maximum resistance to corrosion and oxidation.

What is claimed is:

1. Method for evaporating melts of alloys of metals of different vapor pressures from a continuously fed, large-area evaporating crucibles by direct bombardment of the bath surface with focused electron beams which are periodically deflected according to a pattern wherein the alloy material is deposited on a plurality of substrates which are disposed in a field above the evaporating crucible with local adaptation of the energy density to the thermal economy of the melt bath which comprises deflecting at least one electron beam onto at least two substantially rectangular beam fields $F_1$, $F_2$ . . . , guiding the electron beam in each of these fields through a line raster at a frequency of at least 100 Hz, shifting periodically from one to the other field at a shift frequency of at most 5 Hz, the dwell time of the electron beam within each field being selected at $T_1$, $T_2$, . . . ; the area ratios of the beam fields $F_1$, $F_2$ and the relative dwell times $T_1$, $T_2$ being adjustable independently of one another, and the sum of the areas of all beam fields being between 10% and 80% of the area of the bath surface.

2. Method of claim 1 wherein, in the case of a rectangular evaporation crucible, the individual beam fields $F_1$, $F_2$, . . . are disposed in tandem longitudinally of the crucible.

3. Method of claim 1 wherein the bath surface is bombarded on beam fields $F_1$, $F_2$ . . . of different size and the arrangement of the beam fields is made symmetrical from the center of the bath ($F_1$, $F_2$ . . . – . . . $F_2$, $F_1$).

4. Method of claim 3 wherein the larger beam fields $F_1$ are on the outside, the area ratio $F_1:F_2$ being between 1.2:1 and 5:1, and the longer dwell time $T_1$ of the electron beam is put in the outer beam fields, the relative dwell time $T_1:T_2$ being between 1.2 1: and 3:1.

5. Method of claim 4 wherein the area ratio $F_1:F_2$ is 2:1 and the relative dwell time $T_1:T_2$ is 2:1.

6. Method of claim 1 wherein the beam fields $F_1$, $F_2$ . . . are positioned partially overlapping one another on the bath surface.

7. Method of claim 1 wherein the line interval within at least one field is varied over one of the field dimensions, the line density per unit of length being adapted to the local energy requirement.

8. Method of claim 1 wherein turbine blades are vacuum coated with corrosion-resistant and oxidation-resistant alloy coatings.

9. Method of claim 8 wherein the alloy is from the group CoCrAlY and NiCoCrAlY.

* * * * *